United States Patent
MacDonald

(10) Patent No.: US 6,856,924 B2
(45) Date of Patent: *Feb. 15, 2005

(54) MIXER-BASED TIMEBASE FOR SAMPLING MULTIPLE INPUT SIGNAL REFERENCES ASYNCHRONOUS TO EACH OTHER

(75) Inventor: Willard MacDonald, Bolinas, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 54 days.

This patent is subject to a terminal disclaimer.

(21) Appl. No.: 10/374,249

(22) Filed: Feb. 25, 2003

(65) Prior Publication Data

US 2004/0167733 A1 Aug. 26, 2004

(51) Int. Cl.[7] ............................................. G01R 13/00
(52) U.S. Cl. ........................... 702/72; 702/66; 702/69; 702/71; 341/122; 341/120; 324/122; 324/120; 324/76.23; 324/76.24; 324/76.15; 324/76.16; 324/76.19; 324/76.22; 324/76
(58) Field of Search ............................... 702/72, 66, 69, 702/71; 341/122, 120; 324/76.23, 76.24, 76.15, 76.16, 76.19, 76.22, 76

(56) References Cited

U.S. PATENT DOCUMENTS

| 4,495,586 | A | | 1/1985 | Andrews |
| 4,578,667 | A | | 3/1986 | Hollister |
| 4,678,345 | A | | 7/1987 | Agoston |
| 4,719,416 | A | | 1/1988 | Desautels |
| 4,884,020 | A | | 11/1989 | Blakeslee |
| 4,928,251 | A | | 5/1990 | Marzalek et al. |
| 5,260,670 | A | | 11/1993 | Ainsworth et al. |
| 5,315,627 | A | * | 5/1994 | Draving ........................ 377/20 |
| 5,959,479 | A | * | 9/1999 | Woodward ................... 327/160 |
| 6,564,160 | B2 | * | 5/2003 | Jungerman et al. .......... 702/106 |
| 6,573,761 | B1 | * | 6/2003 | MacDonald et al. ........... 327/91 |
| 6,650,101 | B2 | * | 11/2003 | MacDonald et al. ...... 324/76.24 |
| 6,700,516 | B1 | * | 3/2004 | MacDonald ................. 341/122 |

\* cited by examiner

*Primary Examiner*—John Barlow
*Assistant Examiner*—Anthony T. Dougherty

(57) ABSTRACT

Sampling is performed. A strobe signal is generated from a first signal. Multiple sampled signals are sampled using the strobe signal. Each of the multiple sampled signals is synchronous with its own clock reference and each of clock references are asynchronous with respect to each other. Analog-to-digital conversion is performed on each sampled value of each of the multiple sampled signals. For each of the clock references that is not synchronous with the first signal, a phase comparison is performed between the clock reference and the first signal to produce a difference value. The difference value indicates a phase difference between the clock reference and the first signal. Analog-to-digital conversion of the difference value is performed at a frequency determined by the strobe signal.

25 Claims, 3 Drawing Sheets

MIXER-BASED TIMEBASE FOR SAMPLING MULTIPLE INPUT SIGNAL REFERENCES ASYNCHRONOUS TO EACH OTHER

BACKGROUND

The present invention concerns sampling methods used within electronic instruments such as oscilloscopes and pertains particularly to a mixer-based timebase for sampling multiple input signal references asynchronous to each other. Eye diagram analysis is an important tool for studying the behavior of high-speed digital electrical and optical communications signals. An eye diagram is a way of displaying on an oscilloscope the waveform shapes of all logic one-zero combinations. It is generated by applying a data waveform to the vertical channel of an oscilloscope while triggering from a synchronous clock signal.

Currently, at data rates below about 3 gigabits per second (Gb/s), real-time sampling oscilloscopes are commonly used. A real-time sampling oscilloscope employs a very high speed analog-to-digital (A/D) converter to capture a waveform record consisting of a complete sequence of successive data bits. The advantage of real-time sampling is that it allows visualization of the exact characteristics of a data pattern such as slow risetime or excessive overshoot.

The A/D converter in a real time sampling oscilloscope must sample the waveform much faster than the data rate. Shannon's sampling theorem states that to unambiguously reconstruct a sine wave the sample rate must be at least twice the signal frequency. In reality, since digital data signals are not simple sine waves, an even higher sampling rate must be used. Most commercial real-time sampling oscilloscopes employ sampling rates of 4–10 times the data rate.

Currently, the fastest commercial real-time sampling oscilloscopes on the market today are limited to about 6 gigahertz (GHz) bandwidth and 20 gigasamples (GSamp/s) sample rates. This bandwidth is useful only for data rates up to about 2.5 gigabits (Gb/s). For higher data rates, equivalent-time sampling technology is used.

One type of architecture used in an equivalent-time sampling system utilizes sequential timebase circuitry that performs a sequential timebase operation such as detecting a synchronous trigger event (such as a rising or falling edge in the applied trigger signal) and generating a precision programmable delay between the trigger event and the sample strobe. The precision delay generator is typically divided into a course and fine delay generator. Samples are taken at varying times determined by the timebase delay. Each trigger event causes the oscilloscope to take a single sample of the data waveform and display the sample as a single point on the screen. Each subsequent sample point (following a new trigger event) is increasingly delayed relative to the time of the trigger. After numerous trigger events, the oscilloscope fills the display with a sampled representation of the data pattern.

Another type of architecture used in an equivalent-time sampling system utilizes pseudo-random timebase circuitry that performs pseudo-random timebase operations. In pseudo-random timebase operations, the timing of the samples is typically not related to the repetitive signal input. The position of each sample on the time axis of the oscilloscope display is obtained by measuring the timing of each sample relative to an applied reference signal. See, for example U.S. Pat. No. 4,884,020 where a sinusoidal reference is sampled in quadrature to precisely determine the timing of the samples. For additional background information on random electrical sampling, see, for example, U.S. Pat. Nos. 5,315,627, 4,928,251, 4,719,416, 4,578,667 and 4,495,586.

The components used in timebase circuitry in existing sampling systems are quite complex and expensive. When multiple signals such as parallel optical signals in a very short reach (VSR) application are to be sampled and the signals are asynchronous to each other, these expensive components are generally duplicated. It is desirable, therefore, to more economically implement timebase circuitry for multiple asynchronous signals.

SUMMARY OF THE INVENTION

In accordance with the preferred embodiment of the present invention, sampling is performed. A strobe signal is generated from a first signal. Multiple sampled signals are sampled using the strobe signal. Each of the multiple sampled signals is synchronous with its own clock reference and each of the clock references are asynchronous with respect to each other. Analog-to-digital conversion is performed on each sampled value of each of the multiple sampled signals. For each of the clock references that is not synchronous with the first signal, a phase comparison is performed between the clock reference and the first signal to produce a difference value. The difference value indicates a phase difference between the clock reference and the first signal. Analog-to-digital conversion of the difference value is performed at a frequency determined by the strobe signal.

DESCRIPTION OF THE PREFERRED EMBODIMENTS

Figure 1:
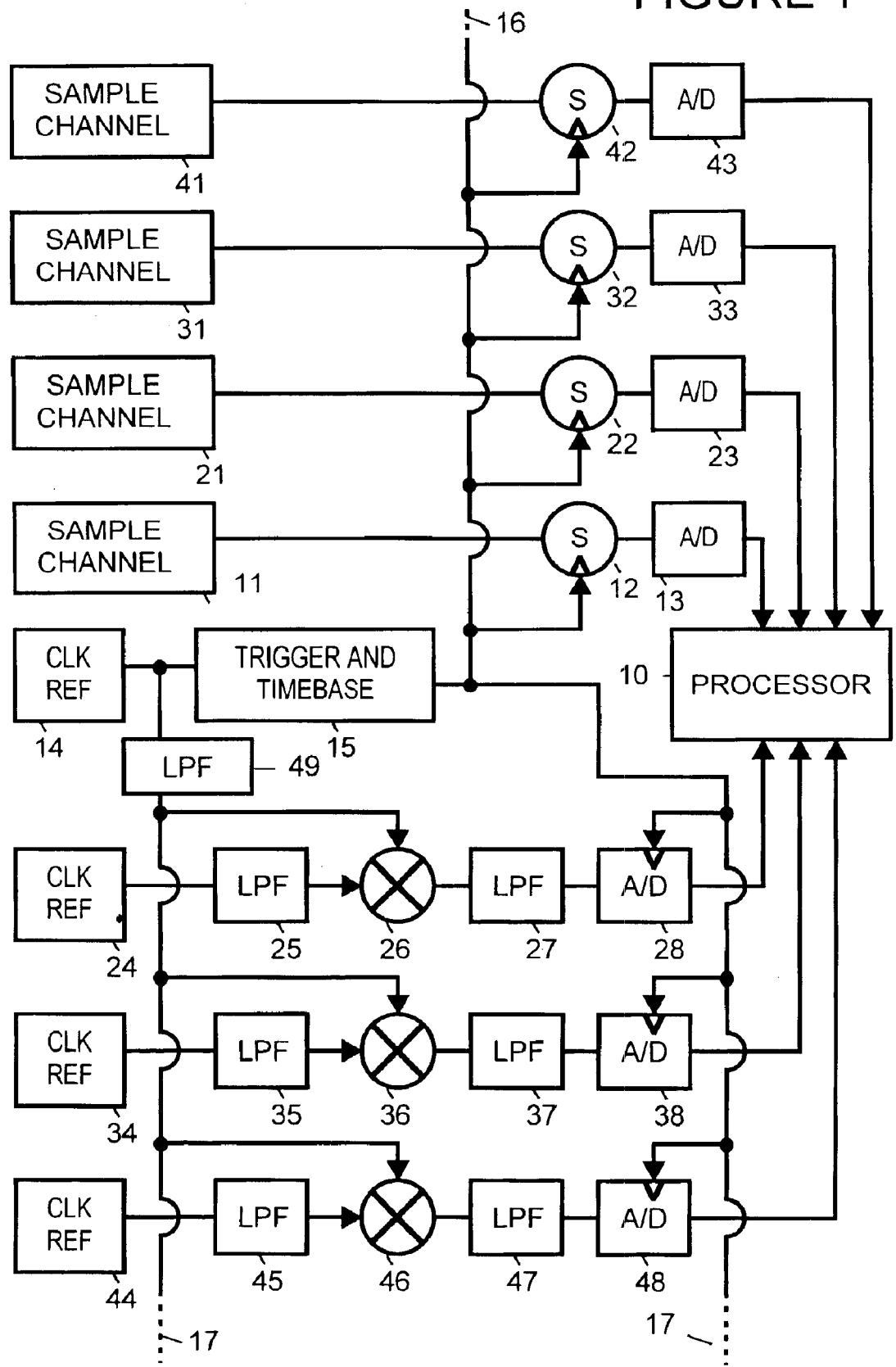
FIG. 1 is a simplified block diagram of sampling circuitry within an electronic device in accordance with a preferred embodiment of the present invention.

FIG. 1 shows timebase circuitry that can be used for multiple channels operating asynchronously to one another.

In FIG. 1, a sampler (S) 12 samples a sample channel signal 11. An A/D converter 13 generates a digital value representing the analog voltage of the sample channel signal 11 at each sampling time. These digital values are stored for use in signal display and analysis. For example, sampler 12 is implement by a fast switch and a storage component. In some embodiments, sampler 12 also can include a step recover diode (SRD) to generate a short sample aperture. A/D converter 13 includes for example, amplification and filtering capability to accurately capture and convert the signals.

A sampler (S) 22 samples a sample channel signal 21. An A/D converter 23 generates a digital value representing the analog voltage of the sample channel signal 21 at each sampling time. These digital values are stored for use in signal display and analysis.

A sampler (S) 32 samples a sample channel signal 31. An A/D converter 33 generates a digital value representing the analog voltage of the sample channel signal 31 at each sampling time. These digital values are stored for use in signal display and analysis.

A sampler (S) 42 samples a sample channel signal 41. An A/D converter 43 generates a digital value representing the analog voltage of the sample channel signal 41 at each sampling time. These digital values are stored for use in signal display and analysis.

A clock reference 14 is synchronous with sample channel signal 11. A low pass filter (LPF) 49, if necessary, can be used to remove any noise and/or harmonics within clock reference 14. Low pass filter 49 can be implemented in hardware. Alternatively, the function of low pass filter 49 can be implemented in the software used to process information gathered about clock reference 14. When clock reference 14 is a sufficiently clean sinusoid, low pass filter 49 can be omitted.

Trigger and timebase circuitry 15 is used to produce a strobe signal used to control timing of samples by sampler 12, sampler 22, sampler 32, sampler 42, A/D converter 28, A/D converter 38 and A/D converter 48. Trigger and timebase circuitry 15 includes, for example, a sequential timebase circuit or a pseudo-random timebase circuit.

For example, in alternative embodiments of the present invention, trigger and timebase circuitry 15 can include a frequency divider that is implemented by a phase locked loop, a counter or some other circuitry that accomplishes division of signal frequency.

A processor 10 receives data from A/D converter 13, A/D converter 23, A/D converter 33, A/D converter 43, A/D converter 28, A/D converter 38 and A/D converter 48 and uses the data to perform digital display and analysis.

While FIG. 1 shows only sample channel signal 11, sample channel signal 21, sample channel signal 31, sample channel signal 41 and corresponding timebase portions, as represented by a line 16, and lines 17, trigger and timebase circuitry 15 can supply the strobe signal to additional samplers and corresponding timebase portions facilitating the sampling of additional asynchronous sample channel signals. Embodiments of the present invention also can be implemented with only two or three sample channels.

In the embodiment of the present invention shown in FIG. 1, no additional trigger and timebase circuitry in addition to trigger and timebase circuitry 15 is required to perform equivalent time sampling scope measurements on multiple signals in parallel where each signal is accompanied by a synchronous clock reference, but where the multiple clock references are asynchronous with respect to each other. This is advantageous in the case where, for example, manufacturing tests are performed simultaneously on two or more independent transceiver modules. This is also advantageous in the case where, for example, there are parallel optics modules in which the individual channels are asynchronous with each other. The ability to measure asynchronous signals simultaneously can dramatically reduce manufacturing test time.

To measure asynchronous signals simultaneously, trigger and timebase circuitry 15 can be duplicated multiple times, one for each of the asynchronous clock references. However, the components used to implement trigger and timebase circuitry 15 are typically expensive, complicated and sensitive.

In the present invention, therefore, an RF phase detector or mixer is used to determine the relative phase difference between clock reference 14 and clock references for the other clock references. Trigger and timebase circuitry 15 determines the timing of the samples within a period of clock reference 14, and each mixer determines the relative phase difference between the clock reference 14 and the other clock references. This phase difference is then used to precisely establish the timing of the sample within a period of clock reference 14.

A clock reference 24 is synchronous with sample channel signal 21. A low pass filter (LPF) 25 is used to remove any noise and/or harmonics within clock reference 24. Low pass filter 25 can be implemented in hardware. Alternatively, the function of low pass filter 25 can be implemented in the software used to process information gathered about clock reference 24. Provided clock reference 24 is a sufficiently clean sinusoid, low pass filter 25 may be omitted.

A mixer 26 performs a mix operation between the frequency signal generated by clock reference 14 and clock reference 24 producing an intermediate frequency (IF) that is the sum and difference of frequencies input to mixer 26. A low pass filter (LPF) 27 removes the sum component of the mixed signal, leaving the difference component of the mixed signal. The difference component of the mixed signal indicates the frequency difference between clock reference 24 and the frequency signal generated by clock reference 14. Mixer 26 and LPF 27 together function as a phase comparator. While in the frequency domain, the output of the phase comparator is the frequency difference between clock reference 24 and the frequency signal generated by clock reference 14, in the time domain, the output of the phase comparator is the instantaneous phase difference between clock reference 24 and the frequency signal generated by clock reference 14.

A/D converter 28 generates digital values indicating the frequency difference. When the frequency difference between clock reference 24 and clock reference 14 is small, the difference component of the mixed signal will be low frequency, allowing A/D converter 28 and any other following processing circuitry to operate at low frequency. Low frequency operation allows for a significant cost savings in components.

Typically the frequency difference between the clock references is small when testing multiple devices centered around the same rate (e.g., OC-192 at 9.95328 gigabits per second). Typically when testing a parallel optics device, the clock reference for each of the individual channels will be at the same rate; however they are often not phase locked to each other. Any small drift in frequency or phase between clocks 14 and 24 is detected by mixer 26 and compensated for.

A clock reference 34 is synchronous with sample channel signal 31. A low pass filter (LPF) 35 is used to remove any noise and/or harmonics within clock reference 34. A mixer 36 performs a mix operation between the frequency signal generated by clock reference 14 and clock reference 34. A low pass filter (LPF) 37 removes the sum component of the mixed signal, leaving the difference component of the mixed signal. An A/D converter 38 generates digital values indicating the frequency difference.

A clock reference 44 is synchronous with sample channel signal 41. A low pass filter (LPF) 45 is used to remove any noise and/or harmonics within clock reference 44. A mixer 46 performs a mix operation between the frequency signal generated by clock reference 14 and clock reference 44. A low pass filter (LPF) 47 removes the sum component of the mixed signal, leaving the difference component of the mixed signal. An A/D converter 48 generates digital values indicating the frequency difference.

Figure 2:
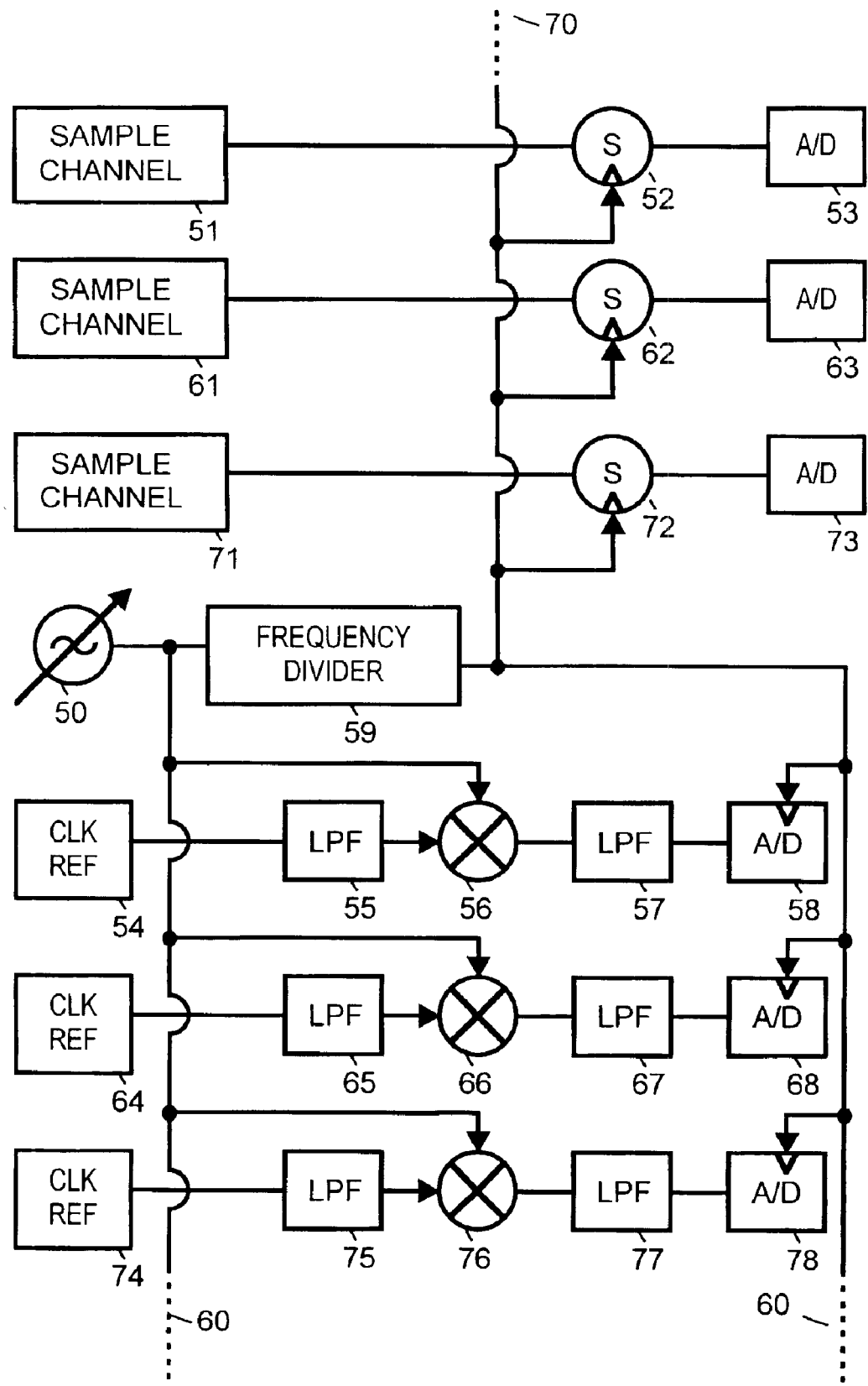
FIG. 2 is a simplified block diagram of sampling circuitry within an electronic device in accordance with another alternative preferred embodiment of the present invention.

FIG. 2 is a simplified block diagram of sampling circuitry within an electronic device in accordance with another alternative preferred embodiment of the present invention.

In the embodiment shown in FIG. 2, a sampling oscillator 50 and a frequency divider 59 are used to perform pseudo-random sampling.

A sampler (S) 52 samples a sample channel signal 51. An A/D converter 53 generates a digital value representing the analog voltage of the sample channel signal 51 at each sampling time. These digital values are stored for use in signal display and analysis. For example, sampler 52 is implemented by a fast switch and a storage component. In some embodiments, Sampler 52 also can include a step recover diode (SRD) to generate a short sample aperture. A/D converter 53 includes for example, amplification and filtering capability to accurately capture and convert the signal.

A sampler (S) 62 samples a sample channel signal 61. An A/D converter 63 generates a digital value representing the analog voltage of the sample channel signal 61 at each sampling time. These digital values are stored for use in signal display and analysis.

A sampler (S) 72 samples a sample channel signal 71. An A/D converter 73 generates a digital value representing the analog voltage of the sample channel signal 71 at each sampling time. These digital values are stored for use in signal display and analysis.

Sampling oscillator 50 generates a high frequency signal that is frequency divided by frequency divider 59 in order to produce a sampling signal used to control timing of samples by sampler 52, sampler 62, sampler 72, A/D converter 58, A/D converter 68 and A/D converter 78. For example, frequency divider 59 is implemented by a phase locked loop, a counter or some other circuitry that accomplishes division of signal frequency. In this case, for example, the trigger system includes frequency divider 59, the sampling signal produced by frequency divider 59 is a strobe signal and sampling oscillator 50 produces a signal from which the strobe signal is generated. Provided sampler 52, sampler 62, sampler 72, A/D converter 58, A/D converter 68 and A/D converter 78 are able to operate within the frequency range of sampling oscillator 50, frequency divider 59 can be omitted. In this case, the signal produced by sampling oscillator 50 is identical with the strobe signal and the trigger system delivers the first signal as the strobe signal.

While FIG. 2 shows only sample channel signal 51, sample channel signal 61, sample channel signal 71, and corresponding timebase portions, as represented by a line 70, and lines 60, frequency divider 59 can supply the sampling signal to additional samplers and corresponding timebase portions facilitating the sampling of additional asynchronous sample channel signals. Embodiments of the present invention also can be implemented with only two sample channels.

A clock reference 54 is synchronous with sample channel signal 51. A low pass filter (LPF) 55 is used to remove any noise and/or harmonics within clock reference 54. Low pass filter 55 can be implemented in hardware. Alternatively, the function of low pass filter 55 can be implemented in the software used to process information gathered about clock reference 54. Provided clock reference 54 is a sufficiently clean sinusoid, low pass filter 55 may be omitted.

An RF mixer 56 performs a mix operation between the high frequency signal generated by sampling oscillator 50 and clock reference 54 producing an intermediate frequency (IF) that is the sum and difference of frequencies input to mixer 56. A low pass filter (LPF) 57 removes the sum component of the mixed signal, leaving the difference component of the mixed signal. The difference component of the mixed signal indicates the frequency difference between clock reference 54 and the high frequency signal generated by sampling oscillator 50. Mixer 56 and LPF 57 together function as a phase comparator. While in the frequency domain, the output of the phase comparator is the frequency difference between clock reference 54 and the high frequency signal generated by sampling oscillator 50, in the time domain, the output of the phase comparator is the instantaneous phase difference between clock reference 54 and the high frequency signal generated by sampling oscillator 50.

An A/D converter 58 generates digital values indicating the phase difference. When the phase difference between clock reference 54 and the high frequency signal generated by sampling oscillator 50 is small, the difference component of the mixed signal will be low frequency, allowing A/D converter 58 and any other following processing circuitry to operate at low frequency. Low frequency operation allows for a significant cost savings in components.

A clock reference 64 is synchronous with sample channel signal 61. A low pass filter (LPF) 65 is used to remove any noise and/or harmonics within clock reference 64. An RF mixer 66 performs a mix operation between the high frequency signal generated by sampling oscillator 50 and clock reference 64. A low pass filter (LPF) 67 removes the sum component of the mixed signal, leaving the difference component of the mixed signal. An A/D converter 68 generates digital values indicating the phase difference at each time sample channel signal 61 is sampled.

A clock reference 74 is synchronous with sample channel signal 71. A low pass filter (LPF) 75 is used to remove any noise and/or harmonics within clock reference 74. An RF mixer 76 performs a mix operation between the high frequency signal generated by sampling oscillator 50 and clock reference 74. A low pass filter (LPF) 77 removes the sum component of the mixed signal, leaving the difference component of the mixed signal. An A/D converter 78 generates digital values indicating the phase difference at each time sample channel signal 71 is sampled.

Figure 3:
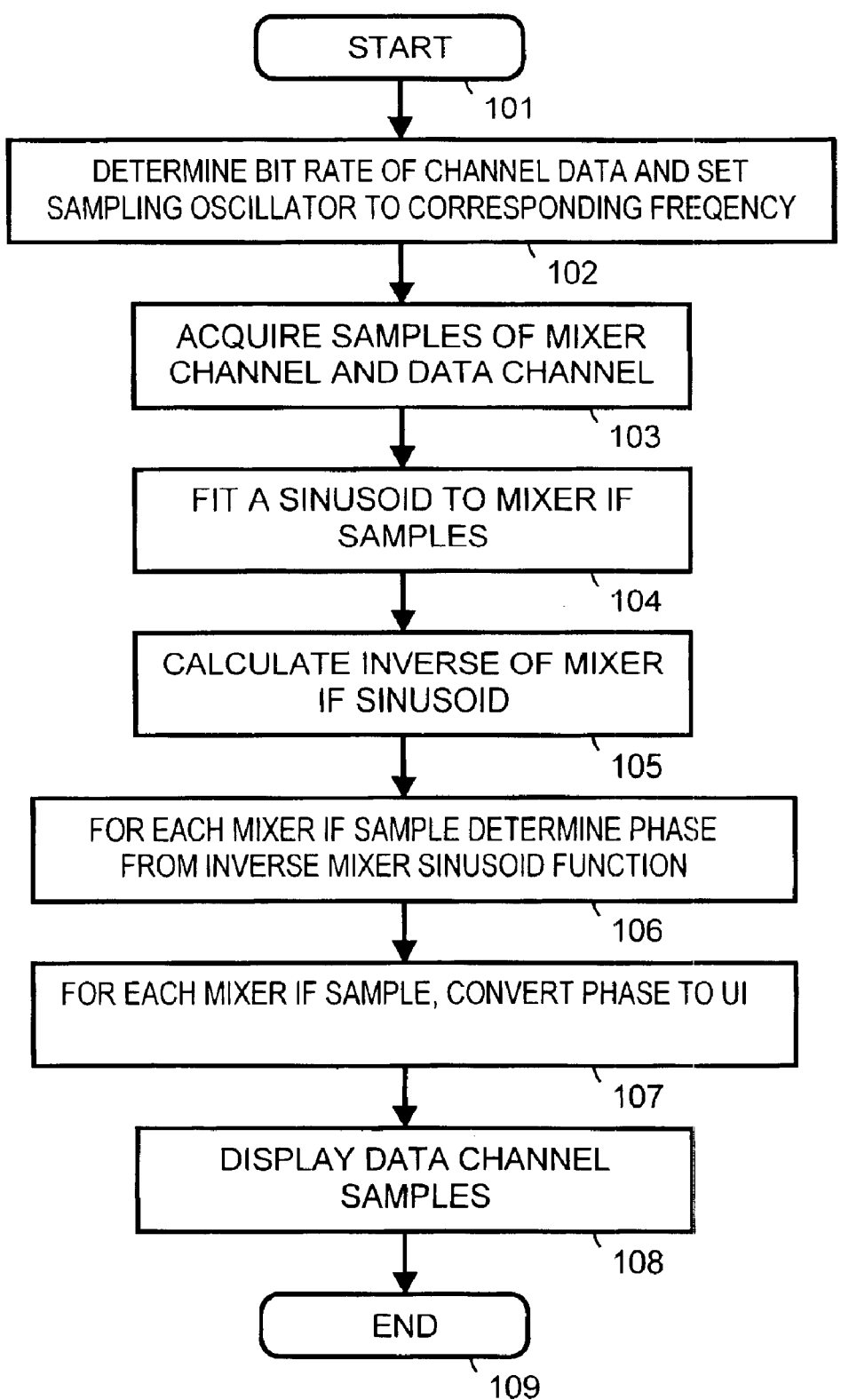
FIG. 3 is a flowchart that describes determination of timing data from information obtained by the sampling circuitry shown in FIG. 3 in accordance with a preferred embodiment of the present invention.

FIG. 3 is a flowchart that describes determination of timing data for each channel from information obtained and stored by the A/D converters. The process starts in a block 101.

In a block 102, the nominal data rate (also called the bit rate) of the sample channels are determined and sampling oscillator 50 is set to a corresponding frequency. For example, a user indicates the nominal data rate or it is derived from an incoming signal. For example, the user indicates the nominal data rate is 9.95324 Gb/s as defined by the SONET OC-192 standard. Alternatively, the bit rate can be derived from one of the clock references. For example, for sample channel signal 51, the bit rate can be determined by the frequency of clock reference 54. For sample channel signal 61, the bit rate can be determined by the frequency of clock reference 64. For sample channel signal 71, the bit rate can be determined by the frequency of clock reference 74. When there is no sampling oscillator (as in FIG. 1) it is not necessary to determine a nominal data rate and block 102 can be omitted.

In a block 103, samples of the mixer channel are taken simultaneously with samples of the data channels. For example, A/D converter 53 captures sampled data channel voltage values of $S_K$ (where K ranges from 0 to N). Simultaneously A/D converter 58 captures sampled mixer channel voltage values of $a_0, a_1, a_2, \ldots a_N$.

In a block 104, a sinusoid waveform is fitted to the mixer samples ($a_0, a_1, a_2, \ldots a_N$). For example, the sinusoidal waveform (IF(t)) has a form as set out in Equation 1 below, where A represents amplitude, (ω represents frequency and t represents time.

$$IF(t)=A*\cos(\omega*t) \qquad \text{Equation 1}$$

Where amplitude and/or frequency of clock referenced 54, 64 and 74 change over time, using a narrow time window of data to calculate the form of the sinusoidal waveform (IF(t)) allows detection of and correction for the change. Thus adjusting the time window can improve accuracy.

In a block 105, an inverse of the sinusoidal waveform is calculated. For each sampled mixer channel voltage value ($a_K$) that occurs in the fitted sinusoidal waveform between 0 and π, the inverse ($I_K$) is calculated using Equation 2 below:

$$I_K=\arccos(a_K/A) \qquad \text{Equation 2}$$

For each sampled mixer channel voltage value ($S_K$) that occurs in the fitted sinusoidal waveform between π and 2π, the inverse ($I_K$) is calculated using Equation 3 below:

$$I_K=2\pi-\arccos(a_K/A) \qquad \text{Equation 3}$$

In a block 106, for each of the mixer samples ($a_0, a_1, a_2, \ldots a_N$), a phase is determined from the inverse of the sinusoidal waveform, calculated in block 105.

In a block 107, for each of the mixer channel voltage values ($a_0, a_1, a_2, \ldots a_N$), the phase calculated in block 106 is converted to a bit period unit interval (UI). For example, this is accomplished using Equation 4 below.

$$UI(a_K)=(I_K)/(2*\pi) \qquad \text{Equation 4}$$

In a block 108, the data samples are used to represent the sampled data.

The sampled data may be displayed. For example, when displaying each data sample, the vertical component is determined by the sampled data channel voltage values of $S_K$ and the horizontal component is determined by the bit period interval UI($a_K$).

Alternatively, the horizontal component may be represented in seconds instead of unit intervals by dividing the unit intervals calculated in Equation 4 by the bit rate (determined in block 102) to convert unit intervals to seconds.

The sampled data also can be used for additional measurements and/or manipulated to provide further information about the sample channel signal.

In a block 109, the process is completed.

For the sampling circuitry shown in FIG. 2, sampler 52, sampler 62 and sampler 72 operate at a sampling frequency, for example, of approximately 40 kilohertz (kHz). In such a system, the frequency of the signal received by each of A/D converter 58, A/D converter 68 and A/D converter 78, needs to be 20 kHz or less in order to provide adequate resolution of the captured signal.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for performing sampling, the method comprising the following steps:
    (a) generating a strobe signal from a first signal;
    (b) sampling multiple sampled signals using the strobe signal, wherein each of the multiple sampled signals is synchronous with its own clock reference, the clock references being asynchronous with respect to each other, including the following substep:
        performing analog-to-digital conversion on each sampled value of each of the multiple sampled signals; and,
    (c) for each of the clock references that is not synchronous with the first signal, performing the following substeps:
        performing a phase comparison between the clock and the first signal to produce a difference value that indicates a phase difference between the clock reference and the first signal, and
        performing analog-to-digital conversion of the difference value.

2. A method as in claim 1 wherein a first clock reference from the clock references is the first signal.

3. A method as in claim 1 wherein none of the clock references are synchronous with the first signal.

4. A method as in claim 1 wherein step (a) includes the following substep:
    performing a sequential timebase operation on the first signal.

5. A method as in claim 1 wherein step (a) includes the following substep:
    performing a pseudo-random timebase operation on the first signal.

6. A method as in claim 1 wherein step (a) includes the following substep:
    frequency dividing the first signal.

7. A method as in claim 1 wherein in step (c) the analog-to-digital conversion of the difference value is captured based on the strobe signal.

8. A sampling system for performing sampling, the sampling system comprising:
    strobe generation means for generating a strobe signal from a first signal; and,
    sampling means for sampling multiple sampled signals using the strobe signal, wherein each of the multiple sampled signals is synchronous with its own clock reference and each of clock references are asynchronous with respect to each other, the sampling means comprising a plurality of converter means for performing analog-to-digital conversion on each sampled value of each of the multiple sampled signals;
    wherein for each of the clock references that is not synchronous with the first signal, the sampling system additionally comprises:
        phase comparator means for performing a phase comparison between the clock reference and the first signal to produce a difference value that indicates a phase difference between the clock reference and the first signal, and
        conversion means for performing analog-to-digital conversion of the difference value.

9. A sampling system as in claim 8 wherein a first clock reference from the clock references is the first signal.

10. A sampling system as in claim 8 wherein none of the clock references are synchronous with the first signal.

11. A sampling system as in claim 8 wherein the strobe generation means performs a sequential timebase operation on the first signal.

12. A sampling system as in claim 8 wherein the strobe generation means performs a pseudo-random timebase operation on the first signal.

13. A sampling system as in claim 8 wherein the strobe signal is identical with the first signal.

14. A sampling system for performing sampling, the sampling system comprising:
- trigger system that generates a strobe signal from a first signal;
- a plurality of samplers, each sampler using the strobe signal to sample one of a plurality of sampled signals, wherein each sampled signal from the plurality of sampled signals is synchronous with one clock reference from a plurality of clock references and each of the clock references in the plurality of clock references are asynchronous with respect to each other; and,
- a plurality of analog-to-digital (A/D) converters, each A/D converter in the plurality of A/D converters performing analog-to-digital conversion for one of the sampled signals in the plurality of sampled signals;
- wherein for each clock reference that is not synchronous with the first signal, the sampling system additionally comprises:
  - a phase comparator that produces a difference value that indicates a phase difference between the clock reference and the first signal, and
  - a converter that performs analog-to-digital conversion of the difference value at a frequency determined by the strobe signal.

15. A sampling system as in claim 14 wherein a first clock reference from the clock references is the first signal.

16. A sampling system as in claim 14 wherein none of the clock references are synchronous with the first signal.

17. A sampling system as in claim 14 wherein the trigger system performs a sequential timebase operation on the first signal.

18. A sampling system as in claim 14 wherein the trigger system performs a pseudo-random timebase operation on the first signal.

19. A sampling system as in claim 14 wherein the trigger system frequency divides the first signal.

20. A sampling system as in claim 14 additionally comprising a processor that uses data to perform digital display and analysis.

21. A sampling system that performs sampling, the sampling system comprising:
- a first sampler that takes samples of a first sampled signal;
- a first analog-to-digital (A/D) converter that receives the samples from the first sampler;
- a first clock reference synchronous with the first sampled signal;
- a second sampler that takes samples of a second sampled signal;
- a second analog-to-digital (A/D) converter that receives the samples from the second sampler;
- a second clock reference synchronous with the second sampled signal;
- a first phase comparator that produces a first difference value that indicates a phase difference between the first clock reference and the second clock reference;
- a third A/D converter that receives the first difference value; and,
- trigger system that uses the first clock reference to produce a strobe signal, the strobe signal being used to control when the first sampler takes samples of the first sampled signal, when the second sampler takes samples of the second sampled signal and when the third A/D converter accepts the first difference value.

22. A sampling system as in claim 21 wherein the trigger system includes a sequential timebase.

23. A sampling system as in claim 21 wherein the trigger system includes a pseudo-random timebase.

24. A sampling system as in claim 21 additionally comprising:
- a third sampler that takes samples of a third sampled signal;
- a fourth analog-to-digital (A/D) converter that receives the samples from the third sampler;
- a third clock reference synchronous with the third sampled signal;
- a second phase comparator that produces a second difference value that indicates a phase difference between the first clock reference and the third clock reference; and,
- a fifth A/D converter that receives the first difference value;
- wherein the strobe signal is also used to control when the third sampler takes samples of the third sampled signal and when the fifth A/D converter accepts the second difference value.

25. A sampling system as in claim 24 additionally comprising:
- a fourth sampler that takes samples of a fourth sampled signal;
- a sixth analog-to-digital (A/D) converter that receives the samples from the fourth sampler;
- a fourth clock reference synchronous with the fourth sampled signal;
- a third phase comparator that produces a third difference value that indicates a phase difference between the first clock reference and the fourth clock reference;
- a third filter that filters the third mixed signal to produce a third difference value that indicates a frequency difference between the first clock reference and the fourth clock reference; and,
- a seventh A/D converter that receives the first difference value;
- wherein the strobe signal is also used to control when the fourth sampler takes samples of the fourth sampled signal and when the seventh A/D converter accepts the third difference value.

* * * * *